(12) United States Patent
Chae et al.

(10) Patent No.: US 12,272,560 B2
(45) Date of Patent: Apr. 8, 2025

(54) SELECTIVE REMOVAL OF METAL OXIDE HARD MASKS

(71) Applicant: ENTEGRIS, INC., Billerica, MA (US)

(72) Inventors: SeungHyun Chae, Gunpo-si (KR); SeongJin Hong, Cheongju-si (KR); Eric Hong, Bundang-gu (KR); Juhee Yeo, Suwon (KR); WonLae Kim, Gunpo-si (KR); JeongYeol Yang, Gunpo-si (KR)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/559,906

(22) Filed: Dec. 22, 2021

(65) Prior Publication Data

US 2022/0208553 A1 Jun. 30, 2022

Related U.S. Application Data

(60) Provisional application No. 63/131,690, filed on Dec. 29, 2020.

(51) Int. Cl.
| | |
|---|---|
| *H01L 21/31* | (2006.01) |
| *C23F 1/30* | (2006.01) |
| *C23F 1/44* | (2006.01) |
| *C23F 11/04* | (2006.01) |
| *H01L 21/3105* | (2006.01) |

(52) U.S. Cl.
CPC .......... *H01L 21/31056* (2013.01); *C23F 1/30* (2013.01); *C23F 1/44* (2013.01); *C23F 11/04* (2013.01)

(58) Field of Classification Search
CPC .......... H01L 21/31056; H01L 21/31111; C23F 1/30; C23F 1/44; C23F 11/04; C09K 13/08
USPC ................................ 438/697; 252/79.1–79.5
See application file for complete search history.

(56) References Cited

U.S. PATENT DOCUMENTS

| | | | |
|---|---|---|---|
| 6,656,852 B2 | 12/2003 | Rotondaro | |
| 7,148,114 B2 | 12/2006 | Chiu | |
| 8,921,238 B2 | 12/2014 | Wang | |
| 9,678,430 B2 | 6/2017 | Cooper | |
| 10,472,567 B2* | 11/2019 | Chen | C09K 13/10 |
| 2006/0172907 A1* | 8/2006 | Kim | C11D 3/042 |
| | | | 510/175 |
| 2010/0112728 A1* | 5/2010 | Korzenski | H01L 21/02079 |
| | | | 257/E21.294 |
| 2016/0185595 A1 | 6/2016 | Chen et al. | |
| 2019/0276740 A1* | 9/2019 | Kim | C09D 183/04 |
| 2019/0284704 A1* | 9/2019 | Ge | H01L 21/32134 |

FOREIGN PATENT DOCUMENTS

| | | | | |
|---|---|---|---|---|
| JP | 2010526212 A | | 7/2010 | |
| KR | 101880308 B1 | * | 7/2018 | ........... C11D 7/3227 |
| KR | 20200013225 A | | 2/2020 | |
| TW | 201209156 A | | 3/2012 | |
| WO | 2017099211 A1 | | 6/2017 | |
| WO | 2018061582 A1 | | 4/2018 | |
| WO | 2019110680 A2 | | 6/2019 | |
| WO | 2019208685 A1 | | 10/2019 | |
| WO | 2020146748 A1 | | 7/2020 | |

OTHER PUBLICATIONS

Alkylbenzenes, Wikipedia (Year: 1980).*
Shamiryan et al., "Selective Removal of High-K Gate Dielectrics", Chem. Eng. Comm., 196:1475-1535, 2009.
Lowalekar et al., "Etching of zirconium oxide, hafnium oxide, and hafnium silicates in dilute hydrofluoric acid solutions", J. Mater. Res., vol. 19, No. 4, Apr. 2004.
Yao et al., "Spin-on Metal Oxides and Their Applications for Next Generation Lithography", J. Photopolym. Sci. Technol., vol. 29, No. 1, 2016.
Jan Paul, et al., Thin Solid Films, vol. 520, Issue 14, May 1, 2012, pp. 4527-4531. (Abstract).

\* cited by examiner

*Primary Examiner* — Duy Vu N Deo

(57) ABSTRACT

Compositions useful for the selective etching, i.e., removal, of metal oxide hard masks such as zirconium oxide and hafnium oxide, often used as hard masks in microelectronic devices, in the presence of other materials such as polysilicon, silicon dioxide, silicon nitride, and tungsten are provided.

11 Claims, No Drawings

SELECTIVE REMOVAL OF METAL OXIDE HARD MASKS

TECHNICAL FIELD

The invention relates generally to the removal or etching of certain high k dielectric materials, including metal oxide hard masks such as zirconium oxide and hafnium oxide.

BACKGROUND

Conventional semiconductor devices can include large numbers of metal oxide semiconductor field effect transistors ("MOSFET"), each comprising at least one source, drain and gate region. Complementary metal-oxide-semiconductors ("CMOS") use complementary and symmetrical pairs of p-type and n-type MOSFETs, allowing for a higher density of logic functions on a chip.

The gate region of MOS or CMOS transistors is generally made of a gate material (e.g., polysilicon) placed over or on top of an oxide insulator/dielectric (e.g., $SiO_2$), which in turn overlies or is on top of a semiconductor material, a combination that is commonly referred to as a "gate stack." Despite the reference to "metal" in metal gate and metal oxide semiconductors, polysilicon is the most common gate material in conventional gate fabrication. Polysilicon has been a preferred material in the fabrication of gate electrodes due to the ease with which it is deposited, its tolerance to extremely high temperatures (in excess of 900° C.-1000° C.) in subsequent manufacturing steps (e.g., annealing), and its ability to form self-aligned gates. Gate fabrication with metals suffers from many of the problems that polysilicon avoids.

The gate dielectric of choice in the prior art has long been silicon dioxide. As transistors have decreased in size, the thickness of the silicon dioxide dielectric has also been scaled down to improve gate capacitance, thereby enhancing current and device performance. The reduction in silicon dioxide gate thickness below approximately 2 nm has resulted in drastically increased leakage currents due to tunneling, which leads to unwieldy power consumption and reduced device reliability. The solution has been to replace the silicon dioxide gate dielectric with a high-k dielectric material such as zirconium oxide that will allow an increased gate capacitance without the concomitant leakage effects.

Additionally, the utilization of high aspect ratio silicon trenches gives rise to the challenge of selectively etching the zirconium oxide layer or "hard mask" in the presence of silicon dioxide and other materials.

It is known that high k dielectrics such a zirconium oxide can be removed using aqueous solutions comprising acids, an oxidizing agent, and a fluorine compound such as hydrofluoric acid, fluorosulfuric acid, ammonium fluoride, or ammonium bifluoride. (See, for example U.S. Pat. No. 6,656,852). However, such compositions tend to not only etch high k dielectrics such as zirconium oxide, but also etch or degrade other materials which may be present, such as polysilicon, silicon dioxide, silicon nitride, and tungsten.

Consequently, a need remains for improved methods for etching high k dielectric materials such as zirconium oxide in the presence of other materials such as polysilicon, silicon dioxide, silicon nitride, and tungsten.

SUMMARY

In summary, the disclosure provides a composition expected to be useful for the selective etching, i.e., removal, of metal oxide hard masks such as zirconium oxide and hafnium oxide, often used as hard masks in microelectronic devices, in the presence of other materials such as polysilicon, silicon dioxide, silicon nitride, and tungsten. In this regard, certain fluoride compounds are described as the etchant, in compositions within a prescribed pH range for facilitation of the selective removal of zirconium oxide in the presence of other materials. The composition comprises:
 a. water;
 b. a fluoride compound chosen from ammonium fluoride, ammonium bifluoride, and hexafluorosilicic acid;
 c. one or more acids;
 d. one or more corrosion inhibitors;
 e. a water-miscible component chosen from alcohols, glycols, glycol ethers, ammonium halides, and amines;
wherein said composition has a pH of about −2 to 6.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5).

In a first aspect, the invention provides a composition comprising:
 a. water;
 b. a fluoride compound chosen from ammonium fluoride, ammonium bifluoride, and hexafluorosilicic acid;
 c. one or more acids;
 d. one or more corrosion inhibitors; and
 e. a water-miscible component chosen from alcohols, glycols, glycol ethers, ammonium halides, and amines;
 wherein said composition has a pH of about −2 to 6. In certain embodiments, the pH of the composition will be about 0 to about 4, and in other embodiments, about 1 to about 2.

In one embodiment, the fluoride compound is hexafluorosilicic acid.

In one embodiment, the acids of component (c) can be chosen from hydrochloric acid, nitric acid, propionic acid, citric acid, tartaric acid and sulfuric acid, and are utilized in such amounts, along with the other components of the composition to provide the desired pH.

In one embodiment, the alcohol is chosen from methanol, ethanol, isopropanol, butanol, tetrahydrofurfuryl alcohol (THFA), halogenated alcohols (such as 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, and 2-chloroethanol).

In one embodiment, the alcohol is a $C_1$-$C_4$ alkanol and is chosen from methanol, ethanol, propanol, n-butanol, isopropanol, sec-butanol, and t-butyl alcohol ethanol. In one embodiment, the alcohol is ethanol.

In one embodiment, the glycols are chosen from $C_2$-$C_4$ diols and $C_2$-$C_4$ triols, such as ethylene glycol, propylene glycol (PG), 1,3-propanediol, and trimethylolpropane.

In one embodiment, the glycol ethers are chosen from diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, ethylene glycol monophenyl ether, diethylene glycol monophenyl ether hexaethylene glycol monophenylether, dipropylene glycol methyl ether acetate, and tetraethylene glycol dimethyl ether (TEGDE).

In one embodiment, the ammonium halide is ammonium chloride or ammonium bromide.

In one embodiment, the amine is triethylamine. In another embodiment, the amine is a secondary amine. In another embodiment, the amine is chosen from diethyl amine, diisopropyl amine, ethylmethyl amine, diethanol amine, N,N-dimethyl amine, and N-methyl diethanol amine.

In one embodiment, the corrosion inhibitors are chosen from 5-amino-1,3,4-thiadiazole-2-thiol (ATDT), benzotriazole (BTA), 1,2,4-triazole (TAZ), tolyltriazole, 5-methyl-benzotriazole, 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, pentylenetetrazole, 5-phenyl-1H-tetrazole, 5-benzyl-1H-tetrazole, 2-benzylpyridine, succinimide, maleimide, phthalimide, glutarimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, benzothiazole, imidazole, pyrazole, indiazole, adenosine, carbazole, saccharin, and benzoin oxime. Additional corrosion inhibitors include cationic quaternary surfactant salts such as benzalkonium chloride, benzyldimethyldodecylammonium chloride, myristyltrimethylammonium bromide, dodecyltrimethylammonium bromide, hexadecylpyridinium chloride, Aliquat 336 (Cognis), benzyldimethylphenylammonium chloride, Crodaquat TES (Croda Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldimethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimethylammonium bromide, dodecyltrimethylammonium chloride, ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate. 1-decyl-3-methylimidazolium chloride, tridodecylmethylammonium bromide, dimethyldistearylammonium chloride, and hexamethonium chloride. Other corrosion inhibitors include non-ionic surfactants such as PolyFox PF-159 (OMNOVA Solutions), poly(ethylene glycol) ("PEG"), poly(propylene glycol) ("PPG"), PEG-PPG copolymers such as Pluronic F-127 (BASF), anionic surfactants such as dodecylbenzenesulfonic acid, sodium dodecylbenzenesulfonate, and combinations thereof. The quaternary salts can function as both corrosion inhibitors and wetting agents. It will be appreciated that, while quaternary salts are available commercially most often as chlorides or bromides, it is easy to ion-exchange the halide anion with non-halide anions such as sulfate, methanesulfonate, nitrate, hydroxide, and similar salts. Such converted quaternary salts are also contemplated herein. In a particularly preferred embodiment, 5-methyl-1H-benzotriazole is known to block the oxidative activity of the oxidizing agents against copper. Alternatively, or in addition to the 5-methyl-1H-benzotriazole (mBTA), corrosion inhibitors include pyrazole, benzotriazole, the cationic quaternary surfactant salts, more preferably myristyltrimethylammonium bromide, benzalkonium chloride, hexadecyltrimethylammonium p-toluenesulfonate, and hexadecyltrimethylammonium hydroxide, tetrazoles such as 5-benzyl-1H-tetrazole, and combinations thereof.

In another embodiment, the corrosion inhibitors are chosen from myristyltrimethylammonium bromide, benzalkonium chloride, hexadecyltrimethylammonium p-toluenesulfonate, hexadecyltrimethylammonium hydroxide, 5-benzyl-1H-tetrazole, and combinations thereof.

In one embodiment, corrosion inhibitors are chosen from benzalkonium chloride; dodecyl benzalkonium chloride; alkylbenzene sulfonates; and compounds chosen from diphenyl silanol; triethyl silanol; tri-t-butoxysilanol; amino (dimethyl)silanol; aminopropyl diisopropylsilane; aminopropyl silanetriol; (3-aminopropyl)triethoxy-silane; N-(2-aminoethyl)-3-aminopropyl silane triol; $N^1$-(3-trimethoxysilypropyl)diethylenetriamine); 3,3'-(dimethoxysilylene)bis-(1-Propanamine); 1,3-Bis(3-aminopropyl)-1,1,3,3-tetraethoxydisiloxane; and N-(6-aminohexyl)aminopropyltrimethoxysilane, and combinations thereof.

In another embodiment, the corrosion inhibitors are present in an amount of from about 0.001 wt % to about 2 wt %.

In one embodiment, the corrosion inhibitor is a mixture of aminopropyl silanetriol and at least one alkylbenzene sulfonate.

In the above composition, the relative proportions of the components are as follows:
a. about 65 to about 80 weight percent of water;
b. about 4 to about 10 weight percent of a fluoride compound chosen from ammonium fluoride, ammonium bifluoride, and hexafluorosilicic acid;
c. acids, in an amount sufficient to achieve the stated pH of about −2 to about 6;

d. about 1 to about 5 weight percent of corrosion inhibitors; and e. a water-miscible component chosen from alcohols, glycols, glycol ethers, ammonium halides, and amines.

In one embodiment, the fluoride compound is hexafluorosilicic acid.

While it has been observed that hexafluorosilicic acid hydrolyzes to hydrofluoric acid and various forms of amorphous and hydrated silica (i.e., $SiO_2$), the invention provides the utilization of hexafluorosilicic acid, in aqueous compositions, in the presence of certain water-miscible components, at a pH of about 1 to about 2, for the selective etching, i.e., removal, of zirconium oxide in the presence of other materials such as polysilicon, silicon dioxide, silicon nitride, and tungsten. As such, the compositions are particularly useful in the fabrication of high aspect ratio structures which comprise these materials.

As used herein, a "microelectronic device" is a device that includes electrical circuits and related structures of very small (e.g., micron-scale or smaller) dimensions formed thereon. Exemplary microelectronic devices include flat panel displays, integrated circuits, memory devices, solar panels, photovoltaics, and microelectromechanical systems (MEMS). A microelectronic device substrate is a structure such as a wafer (e.g., semiconductor wafer) that includes one or more microelectronic devices or precursors thereof, in a state of being prepared to form a final microelectronic device.

In a second aspect, the invention provides a method of removing a zirconium oxide or hafnium oxide hard mask from a microelectronic device, which comprises contacting the microelectronic device with a composition comprising:

a. water;

b. a fluoride compound chosen from ammonium fluoride, ammonium bifluoride, and hexafluorosilicic acid;

c. one or more acids;

d. one or more corrosion inhibitors; and e. a water-soluble component chosen from alcohols, glycols, glycol ethers, ammonium halides, and amines;

wherein said composition has a pH of about −2 to 6, for a time and at a temperature necessary to effectuate at least partial removal of said hard mask.

In other embodiments, the compositions are as set forth above in various embodiments.

It will be appreciated that it is common practice to make concentrated forms of the compositions to be diluted prior to use. For example, the composition may be manufactured in a more concentrated form and thereafter diluted with at least one solvent at the manufacturer, before use, and/or during use at the fab. Dilution ratios may be in a range from about 0.1 part diluent:1 part composition concentrate to about 100 parts diluent:1 part composition concentrate. The compositions described herein can be easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the semi-aqueous composition, i.e., more dilute or more concentrated, and it will be appreciated that the semi-aqueous compositions can variously and alternatively comprise, consist or consist essentially of any combination of ingredients consistent with the disclosure herein.

Accordingly, in third aspect, the invention provides a kit including, in one or more containers, two or more components adapted to form the compositions described herein. The containers of the kit must be suitable for storing and shipping said composition components, for example, NOWPak® containers (Advanced Technology Materials, Inc., Danbury, Conn., USA). The two or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, can be used to fabricate the liners for said one or more containers. Desirable liner materials are generally processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and similar liner materials. Exemplary thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS; and U.S. Pat. No. 6,698,619 entitled "RETURNABLE AND REUSABLE, BAG-IN-DRUM FLUID STORAGE AND DISPENSING CONTAINER SYSTEM".

A composition as described can be useful for methods of removing high k hard mask materials such as zirconium oxide and hafnium oxide, in the presence of materials such as polysilicon, silicon dioxide, silicon nitride, and tungsten In use, the compositions of the invention can provide etching (i.e., removal) performance that is useful based on commercial performance needs and expectations, and as compared to comparative etching compositions, can provide improved performance with respect to etch rate and selectivity of high k materials such as zirconium oxide and hafnium oxide versus materials such as polysilicon, silicon dioxide, silicon nitride, and tungsten Methods of etching microelectronic device substrates are known in the semiconductor fabrication art and can be performed on known and commercially available equipment. Generally, to etch a substrate to selectively remove a material at a surface of the substrate, etching composition can be applied to the surface and allowed to contact surface structures to selectively remove certain of the structures, chemically.

In an etching step, the composition can be applied to the surface in any suitable manner, such as by spraying the etching composition onto the surface; by dipping (in a static or dynamic volume of the composition) the substrate into etching composition; by contacting the surface with another material, e.g., a pad, or fibrous sorbent applicator element, that has etching composition absorbed thereon; by contacting the substrate with an amount of the etching composition in a circulating pool; or by any other suitable means, manner or technique, by which the etching composition is brought into removal contact with the surface of the microelectronic substrate that contains a high k hard mask material such as zirconium oxide or hafnium oxide. The application may be in a batch or single wafer apparatus, for dynamic or static cleaning.

The conditions (e.g., time and temperature) of a useful etching process can be any that are found to be effective or advantageous. Generally, etching composition is contacted with the surface, such as by submersion in a bath of the etching composition, for a time that is sufficient to selectively remove the desired hard mask material(s). The time of exposure to the etching composition and the temperature of the etching composition can be effective for a desired amount of removal of the hard mask from a surface of the substrate. The amount of time for an etching step should not be too short, because this means that an etch rate of hard mask may be too high, which can lead to process control difficulties and reduced quality of a microelectronic device at the end of an etch step. Of course, the amount of time required for an etch step is advantageously not unduly long, to allow good efficiency and throughput of an etching process and semiconductor fabrication line. Examples of useful times for an etching step may be in a range from about 0.5 minutes to about 3 minutes, or about 1 minute to about 2 minutes, at a temperature in a range of from about 30° C. to about 60° C. Such contacting times and temperatures are illustrative, and any other suitable time and temperature conditions may be employed that are efficacious to achieve the required removal selectivity.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A composition comprising consisting essentially of:
   a. water;
   b. a fluoride compound chosen from ammonium fluoride, ammonium bifluoride, and hexafluorosilicic acid, wherein the fluoride compound comprises about 4 to about 10 percent of the composition by weight;
   c. one or more acids;
   d. dodecylbenzenesulfonic acid and aminopropyl silanetriol; and
   e. a water-soluble component chosen from alcohols, glycols, glycol ethers, ammonium halides, and amines;
   wherein said composition has a pH of about -2 to 6 and wherein the composition preferentially etches zirconium oxide and hafnium oxide compared with polysilicon, silicon dioxide, silicon nitride, and tungsten.

2. The composition of claim 1, wherein the pH is about 0 to about 4.

3. The composition of claim 1, wherein the pH is about 1 to about 2.

4. The composition of claim 1, wherein the one or more acids are chosen from hydrochloric acid and sulfuric acid.

5. The composition of claim 1, wherein the fluoride compound is hexafluorosilicic acid.

6. The composition of claim 1, wherein the water-soluble component is chosen from a $C_1$-$C_4$ alkanol.

7. The composition of claim 6, wherein the $C_1$-$C_4$ alkanol is n-butanol.

8. The composition of claim 1, wherein the water-soluble component is chosen from ethylene glycol, propylene glycol, 1,3-propanediol, and trimethylolpropane.

9. The composition of claim 1, wherein the water-soluble component is chosen from glycol ethers.

10. The composition of claim 9, wherein the glycol ethers are chosen from diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether, dipropylene glycol dimethyl ether, dipropylene glycol ethyl ether, propylene glycol n-propyl ether, dipropylene glycol n-propyl ether, tripropylene glycol n-propyl ether, propylene glycol n-butyl ether, dipropylene glycol n-butyl ether, tripropylene glycol n-butyl ether, propylene glycol phenyl ether, ethylene glycol monophenyl ether, diethylene glycol monophenyl ether hexaethylene glycol monophenylether, dipropylene glycol methyl ether acetate, and tetraethylene glycol dimethyl ether.

11. The composition of claim 10, wherein the glycol ether is diethylene glycol monomethyl ether.

* * * * *